United States Patent
Sicignano et al.

(10) Patent No.: US 6,661,007 B1
(45) Date of Patent: Dec. 9, 2003

(54) METHOD OF DIAGNOSING MAGNIFICATION, LINEARITY AND STABILITY OF SCANNING ELECTRON MICROSCOPE

(75) Inventors: Albert Sicignano, Mt. Kisco, NY (US); Dmitriy Yeremin, Ardsley, NY (US); Tim Goldburt, Chappaqua, NY (US)

(73) Assignee: General Phosphorix LLC, Ardsley, NY (US)

( * ) Notice: Subject to any disclaimer, the term of this patent is extended or adjusted under 35 U.S.C. 154(b) by 220 days.

(21) Appl. No.: 09/696,255

(22) Filed: Oct. 26, 2000

(51) Int. Cl.⁷ .................................................. H01J 37/26
(52) U.S. Cl. ........................ 250/307; 250/310; 250/311
(58) Field of Search ................................ 250/311, 307, 250/310, 306

(56) References Cited

U.S. PATENT DOCUMENTS

| | | | | |
|---|---|---|---|---|
| 4,818,873 A | * | 4/1989 | Herriot | 250/310 |
| 5,302,829 A | * | 4/1994 | Komatsu et al. | 250/307 |
| 5,523,567 A | * | 6/1996 | Kawamata et al. | 250/310 |
| 5,659,174 A | * | 8/1997 | Kaneoka et al. | 250/310 |
| 5,825,670 A | * | 10/1998 | Chernoff et al. | 702/85 |
| 6,384,408 B1 | * | 5/2002 | Yee et al. | 250/252.1 |

* cited by examiner

Primary Examiner—John R. Lee
Assistant Examiner—Paul M. Gurzo
(74) Attorney, Agent, or Firm—I. Zborovrky

(57) ABSTRACT

A method of diagnosing a parameter of a scanning electron microscope such as magnification, linearity and stability, includes loading a reference material into a microscope, setting a permissible limit of a value of the parameters, inputting a pitch of the reference material, inputting a magnification of the microscope, acquiring a set of digital images on the reference material, analyzing the digital image line after line with determination of a pitch of features of the image in each line, in mutually orthogonal directions, checking if all lines of the digital image has been analyzed, determining a mean value of the pitch of the features in each orthogonal direction, comparing the obtained value of the pitch of the image with a known value of the pitch of the reference material to determine a ratio indicative of a modification, and determining a precision of the measurements of the pitch by statistical analysis of the pitch measurements.

6 Claims, 5 Drawing Sheets

METHOD OF DIAGNOSING MAGNIFICATION, LINEARITY AND STABILITY OF SCANNING ELECTRON MICROSCOPE

BACKGROUND OF THE INVENTION

The present invention relates to a method of diagnosing magnification, linearity and stability of a scanning electron microscope.

In scanning electron microscope it is very important to determine each major parameter, such as magnification, linearity, and stability. There are different methods of diagnosing a magnification with the use of reference material and interpretation of the results in a semi-manual form. No methods have been known for diagnosing of linearity and stability. It is therefore believed to be advisable to provide new methods for diagnosing of the above mentioned parameters.

SUMMARY OF THE INVENTION

Accordingly, it is an object of present invention to provide a new method of diagnosing magnification, linearity, and stability of a scanning electron microscope.

In keeping with these objects and with others which will become apparent hereinafter, one feature of present invention resides, briefly stated, in a method of diagnosing magnification, linearity, and stability of scanning electron microscope which includes loading a reference material into a microscope; setting a permissible limit of a value of the parameters; inputting a pitch of the reference material; inputting a magnification of the microscope; acquiring a set of digital images on the reference material; analyzing the digital image line after line with determination of a pitch of features of the image in each line, in mutually orthogonal directions; checking if all lines of the digital image has been analyzed; determining a mean value of the pitch of the features in each orthogonal direction; comparing the obtained value of the pitch of the image with a known value of the pitch of the reference material to determine a ratio indicative of a modification; and determining a precision of the measurements of the pitch by statistical analysis of the pitch measurements.

In accordance with another feature of present invention said obtaining includes obtaining a set of digital images, and performing the subsequent steps for each of the images.

In accordance with another feature of present invention the method includes the step of selecting to diagnose a respective one of the magnification, linearity and stability after loading of the reference material.

In accordance with another feature of present invention, when the parameter is a magnification, said analyzing the pitch between the features in each line includes using the pitches of all determined lines.

In accordance with another feature of present invention, when wherein the parameter is a linearity, said analyzing includes determining the pitches separately for various areas of the image, and thereafter determining a magnification for each of the areas.

In accordance with another feature of present invention, when the parameter is a stability, said analyzing includes comparing the determined linearities in time.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF PREFERRED EMBODIMENTS

Figure 1:
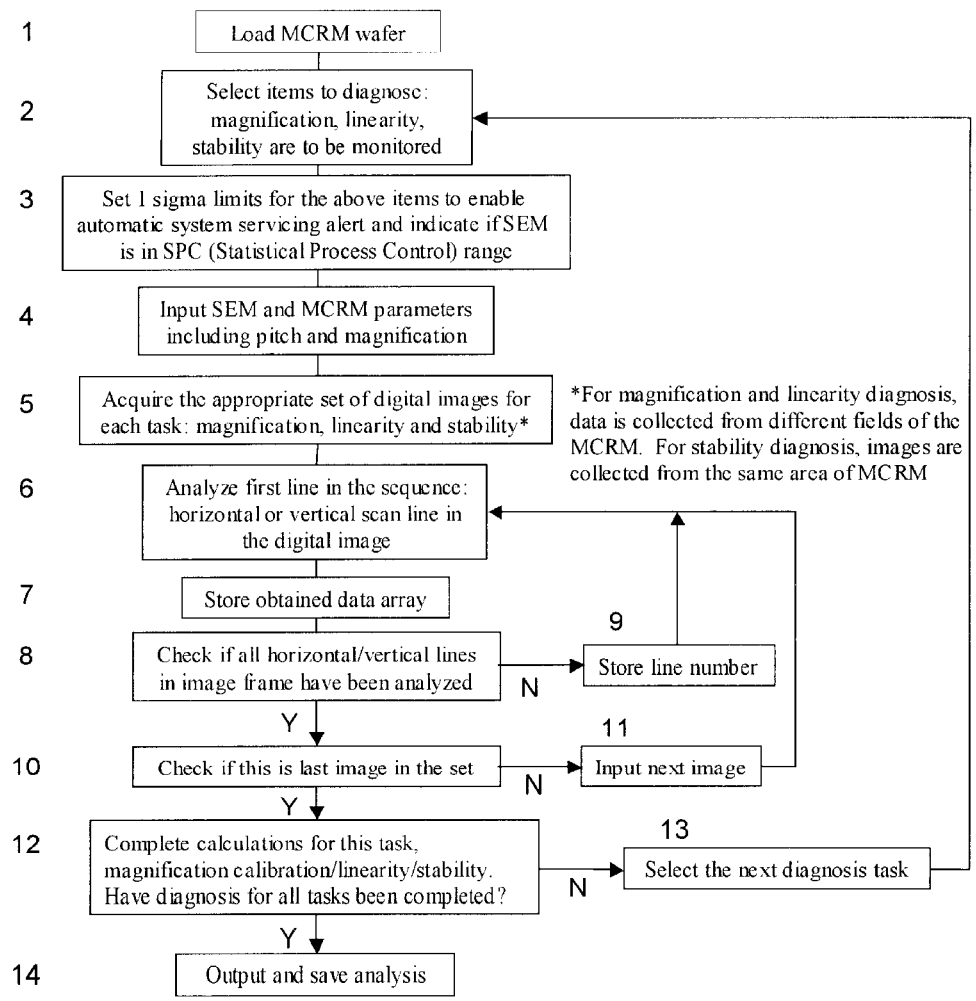
FIG. 1 is a view schematically showing a flow chart of a new method of diagnosing magnification, linearity, and stability of a scanning electron microscope.

In accordance with the present invention at least one parameter selected from the group consisting of a magnification, a linearity and a stability of a scanning electron microscope is to be determined separately, or successively one after the other. The method is illustrated in FIG. 1.

Figure 5A:
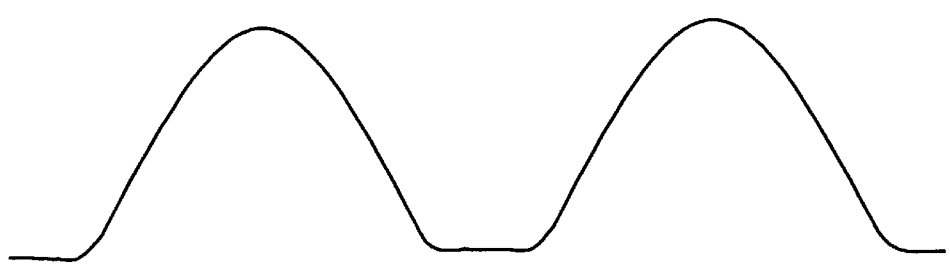
FIGS. 5a–5c are views showing three modifications of reference material which is used in the method of the invention, in two orthogonal directions correspondingly.
Figure 5B:
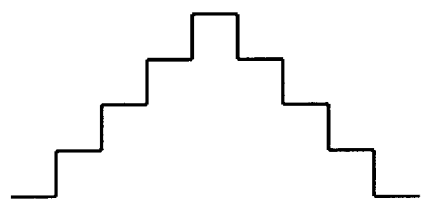
Figure 5C:

In the first step a reference material with a corresponding pattern is loaded in a scanning electron microscope. The reference material is formed with repetitive pattern illustrated in FIGS. 5a, 5b and 5c and disclosed in our copending application Ser. No. 09/696,256.

In the step two, a corresponding parameter to be diagnosed, from the above mentioned three parameters, is selected.

In the step three a limit of the parameter is introduced, for example +/−1% or less. The same limit can be used for linearity. For diagnosing of stability the limit of the parameter can be +/−5% or less.

In the step four, a pitch value of the features of the pattern of the reference material is introduced, and a magnification of the scanning electron microscope is introduced, for diagnosing of each of the above mentioned three parameters.

Then the reference material is scanned in a known manner and a set of digital images of the reference material for determining each parameter is obtained. For the magnification and the linearity, a minimum one digital image can be obtained, while for the stability at least two images are to be obtained. An image includes a plurality of lines of the features of the reference material extending in two orthogonal directions. Each image is the image of the features of the pattern of the reference material in one of the two orthogonal directions. This is performed in step six. During analysis of each line, in this step the pitches between the features of the reference material on the image are determined in each line. Then, a mean pitch from all measurements is determined for each direction. The pitch measurement can be done, for example, using the method described in our patent application Ser. No. 09/346,902.

In the next step a corresponding parameter is determined. For example the magnification is determined by comparing the measured mean pitch of the features on the image with the known pitch between the features of the reference material and obtaining a ratio which is indicative of the magnification in the corresponding direction.

In order to determine the linearity, the individual measurements of the pitch from each line are kept separate, so that the mean pitch for different locations of the image is determined separately, the mean modification for the different locations of the image is determined, and a variation of the magnification for the different locations is indicative of the linearity.

In order to determine the stability, the linearity is first determined for two or more images, the determined linearities of the images are compared with one another, and a degree of the difference between the determined linearities is indicative of the stability.

Figure 2A:
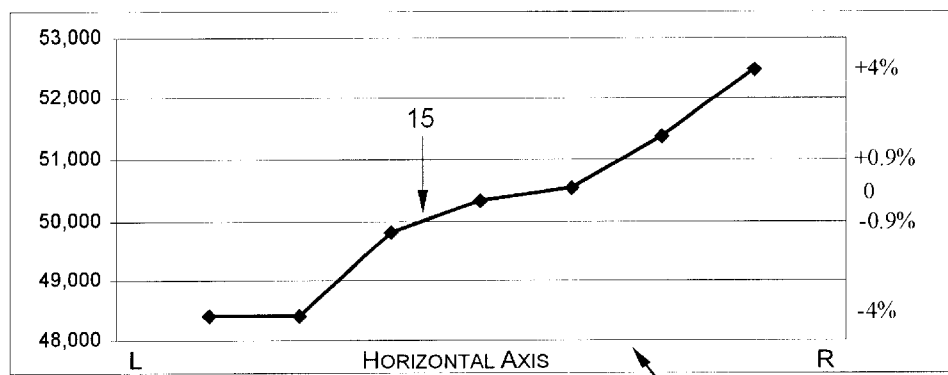
FIGS. 2a and 2b are views showing a change of the magnification of the scanning electron microscope across the field of view in the horizontal and vertical directions.
Figure 2B:
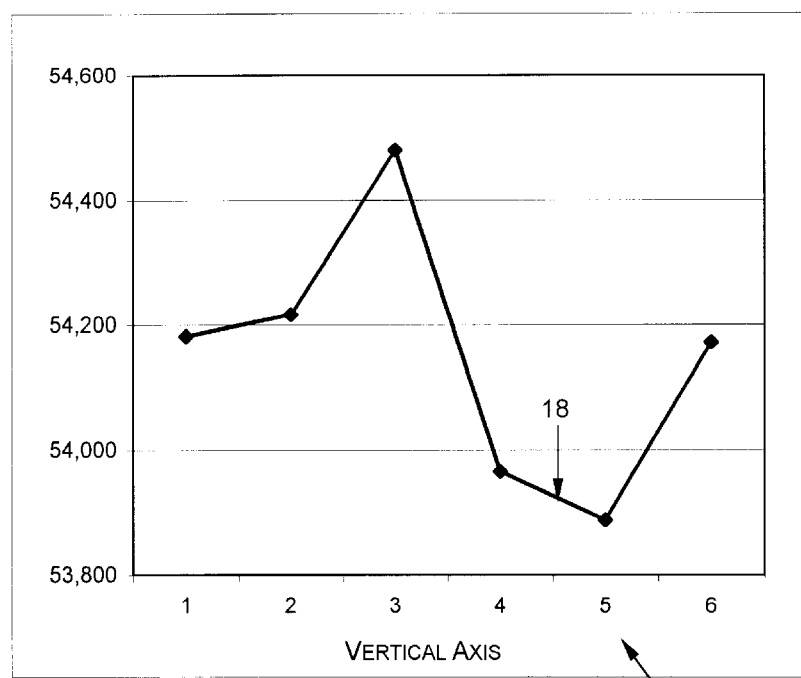

FIGS. 2a and 2b represent linearity plots in the horizontal axis direction, item 16, and in the vertical axis direction, item 17. The curve, item 15, shows a variation in the magnification plotted on the ordinate as a percentage of the magnification plotted across an image field from left to right, and item 18, in a corresponding direction from top to bottom plotted on the abcissa. The linearity is determined in several discrete regions of the image.

Figure 3:
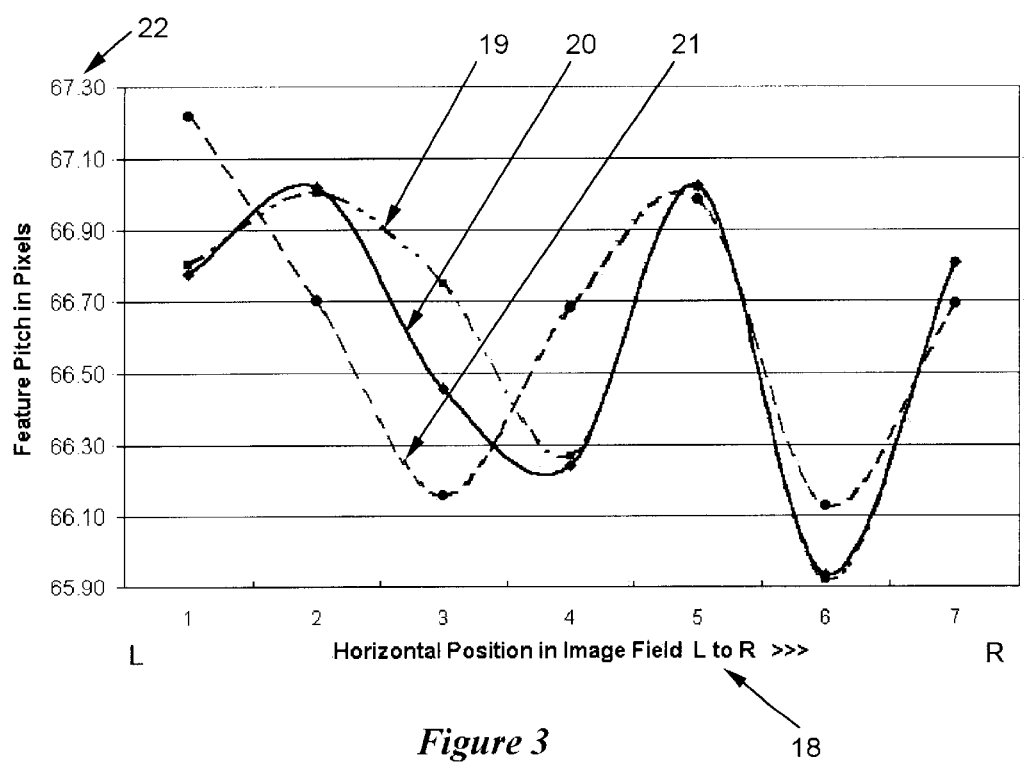
FIG. 3 is a view showing the change of magnification over the field of view as a function of time, in the horizontal direction of the image field.

FIG. 3 shows linearity stability plots in the horizontal position. Three different curves 19, 20 and 21 in FIG. 3 represent the linearities determined from three separate images collected with substantially known time intervals. The linearity in this case is represented on the ordinate and expressed as a pitch in pixels, across an image field from left to right, and from top to bottom correspondingly, plotted on the abcissa. The image field has been analyzed in several discrete regions. The deviation of the curve from one another represents an instability. A measuring of the deviation provides a qualitative value of the stability/instability.

Figure 4:
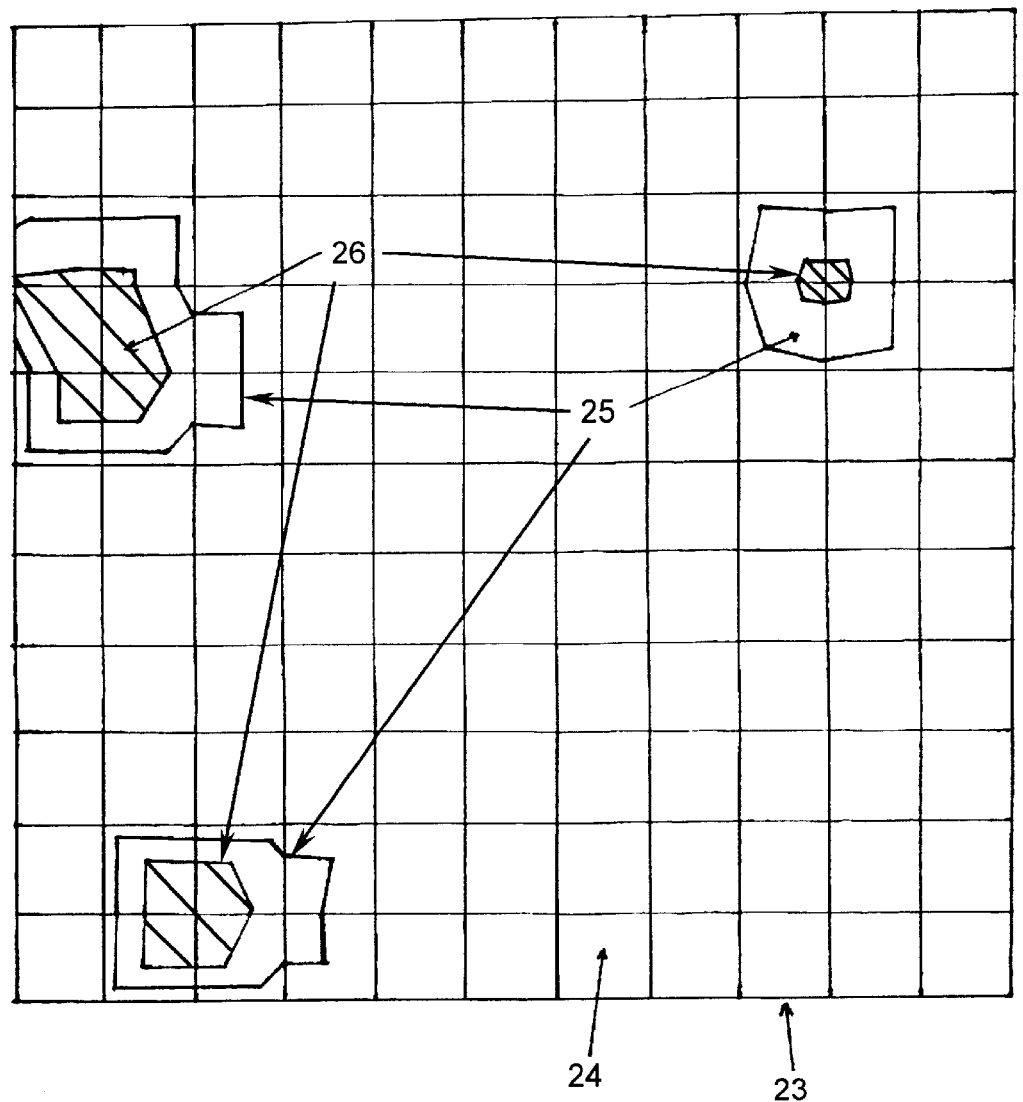
FIG. 4 is a view showing a two-dimensional representation of the changes in magnification across the field of view.

FIG. 4 shows a two dimensional plot representing two dimensional representation of the magnification variation in a horizontal direction. The image field is represented as a matrix 23 including eleven rows and columns. The reference numeral 24 identifies an area with a predetermined magnification, while reference numerals 25 and 26 represent the areas with magnification deviating from that of the area 24.

It will be understood that each of the elements described above, or two or more together, may also find a useful application in other types of methods differing from the types described above.

While the invention has been illustrated and described as embodied in a method of diagnosing magnification, linearity, and stability of scanning electron microscope, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is:

1. A method of diagnosing a parameter of a scanning electron microscope selected from the group consisting of magnification, linearity and stability, comprising the steps of loading a reference material Into a microscope; setting a permissible limit of a value of the parameter; inputting a known pitch value of the reference material; inputting a magnification of the microscope; acquiring a set of digital images of the reference material; analyzing the digital image line of the digital image after line with determination of a pitch of features of the image in each line, in mutually orthogonal directions; checking if all lines of the digital image has been analyzed; determining a mean value of the pitch of the features from the pitches of all lines In each orthogonal direction; comparing the determined mean value of the pitch of the image with the known value of the pitch of the reference material to determine a ratio indicative of a modification; and determining a precision of the measurements of the pitch by statistical analysis of the pitch measuremetnts.

2. A method as defined in claim 1; and further comprising the step of selecting to diagnose a respective one of the magnification, linearity and stability after loading of the reference material.

3. A method as defined in claim 1, wherein the parameter is a linearity, said analyzing the digital image includes determining the pitches separately for various areas of the Image, and thereafter determining a magnification for each of the areas.

4. A method as defined in claim 3, wherein the parameter is a stability, said analyzing includes comparing the determined linearities in time.

5. A method of diagnosing a parameter of a scanning electron microscope selected from the group consisting of magnification, linearity and stability, comprising the steps of loading a reference material into a microscope; setting a permissible limit of a value of the parameter; inputting a known pitch value of the reference material; inputting a magnification of the microscope; acquiring a set of digital images of the reference material; analyzing the digital image line after line with determination of pitches of features of the image in each line, in mutually orthogonal directions; checking if all lines of the digital image have been analyzed; determining a mean value of the pitch of the features of all lines from the pitches of features in each line in each orthogonal direction to determine a mean value of the pitch of the image; comparing the determined mean value of the pitch of the image with the known value of the pitch of the reference material to determine a ratio indicative of a modification; and determining a precision of the measurements of the pitch by statistical analysis of the pitch measurements.

6. A method of diagnosing a parameter of a scanning electron microscope selected from the group consisting of magnification, linearity and stability, comprising the steps of loading a reference material into a microscope; setting a permissible limit of a value of the parameter; inputting a known pitch value of the reference material; inputting a magnification of the microscope; acquiring a set of digital images of the reference material; analyzing the digital image line after line with determination of pitches of features of the image in each line, in mutually orthogonal directions; checking if all lines of the digital image have been analyzed; determining a mean value of the pitch of features of all lines from the pitches of features in each line in each orthogonal direction to determine a mean value of the pitch of the image; comparing the determined mean value of the pitch of the image with the known value of the pitch of the reference material to determine a ratio indicative of a modification; and determining a precision of the measurements of the pitch by statistical analysis of the pitch measurements; and further comprising the step of selecting to diagnose a respective one of the magnification, linearity and stability after loading of the reference material.

* * * * *